United States Patent
Kojima et al.

(10) Patent No.: US 6,740,411 B2
(45) Date of Patent: May 25, 2004

(54) EMBEDDING RESIN, WIRING SUBSTRATE USING SAME AND PROCESS FOR PRODUCING WIRING SUBSTRATE USING SAME

(75) Inventors: Toshifumi Kojima, Komaki (JP); Hiroki Takeuchi, Komaki (JP); Kazushige Obayashi, Nagoya (JP)

(73) Assignee: NGK Spark Plug Co. Ltd., Aichi (JP)

( * ) Notice: Subject to any disclaimer, the term of this patent is extended or adjusted under 35 U.S.C. 154(b) by 56 days.

(21) Appl. No.: 10/042,317

(22) Filed: Jan. 11, 2002

(65) Prior Publication Data
US 2002/0161100 A1 Oct. 31, 2002

(30) Foreign Application Priority Data
Feb. 21, 2001 (JP) ...................................... P.2001-044795

(51) Int. Cl.[7] .............................................. B32B 27/38
(52) U.S. Cl. ..................... 428/413; 428/416; 428/418; 428/901; 438/118; 438/126; 438/127; 438/745

(58) Field of Search .................................. 428/413, 416, 428/418, 901; 438/118, 125, 126, 127, 689, 745; 524/427, 434; 525/105

(56) References Cited

U.S. PATENT DOCUMENTS 6,376,053 B1 * 4/2002 Nakamura et al. .......... 428/209

FOREIGN PATENT DOCUMENTS

| JP | 9-46046 | 2/1997 |
|----|---------|--------|
| JP | 11-126978 | 5/1999 |
| JP | 2000-124352 | 4/2000 |

OTHER PUBLICATIONS

English translation of JP 09046046.*

* cited by examiner

Primary Examiner—David J. Buttner
Assistant Examiner—Christopher Keehan
(74) Attorney, Agent, or Firm—Sughrue Mion, PLLC

(57) ABSTRACT

An embedding resin for embedding an electronic part in a wiring substrate, includes at least one of a soluble resin and a soluble organic filler as a soluble component to be dissolved with an oxidizing agent.

8 Claims, 10 Drawing Sheets

US 6,740,411 B2

EMBEDDING RESIN, WIRING SUBSTRATE USING SAME AND PROCESS FOR PRODUCING WIRING SUBSTRATE USING SAME

BACKGROUND OF THE INVENTION

1. Field of the Invention

The present invention relates to an embedding resin (filling resin) for embedding an electronic part such as chip capacitor, chip inductor and chip resistor in a wiring circuit board (wiring board or wiring substrate), a wiring circuit board having an electronic part embedded therein and a process for producing a wiring circuit board using the embedding resin. More particularly, the present invention is suitable for multi-layer wiring circuit board, package for receiving semiconductor element, etc.

2. Description of the Related Art

In recent years, a multi-chip module (MCM) having a number of semiconductor elements mounted on a build-up wiring circuit board has been studied. An electronic part such as chip capacitor, chip inductor and chip resistor is, normally surface-mounted on amounting wiring layer formed on the surface of a wiring circuit board with a solder.

However, when electronic parts are surface-mounted on the surface of a build-up wiring circuit board, a predetermined mounting area corresponding to individual electronic parts, naturally restricting the miniaturization of the wiring circuit board. In some arrangement (treatment) of wiring during the surface mounting, parasitic impedance which is undesirable from the standpoint of properties increases, causing a problem that the use of electronic equipment at higher frequencies can be difficultly coped with.

In order to solve these problems, various methods involving the embedding of electronic parts in the wiring circuit board have been studied. Japanese Patent Laid-Open No. 1999-126978 discloses a method which comprises previously solder-mounting an electronic part on a wiring circuit board with a transferring sheet made of a metallic foil, and then transferring the electronic part to another wiring circuit board. However, this method leaves something to be desired in accuracy of positioning during mounting, etc. Japanese Patent Laid-Open No. 2000-124352 discloses a multi-layer wiring circuit board having an insulating layer built-up on an electronic part embedded in a core substrate.

The method involving the embedding of an electronic part in a core substrate requires that the gap between the core substrate and the electronic part be filled with a resin and the electrode of the electronic part and the wiring formed on the insulating layer be connected to each other by electroless plating or the like. In this case, an ordinary embedding resin cannot be provided with a sufficient adhesion to a deposit (plating) as a wiring, causing a problem of deposit blister (e.g., 29 of FIG. 5) in a reliability test. A wiring circuit board having a capacitor incorporated therein is disadvantageous in that the reliability in adhesion of wiring decreases when a large current flows as in a power supply wiring formed on an embedding resin having a capacitor embedded therein. However, no embedding resin aimed at improvement of adhesion of deposit has been studied.

SUMMARY OF THE INVENTION

An object of the invention is to provide an embedding resin which can enhance the mounting density of wiring circuit board having electronic parts mounted thereon and exhibit a high reliability in a reliability test such as impact resistance test and water resistance test, a wiring circuit board using the embedding resin and a process for producing a wiring circuit board using the embedding resin.

The embedding resin of the invention comprises at least one of a soluble resin and a soluble organic filler incorporated therein as a soluble component which can be dissolved with an oxidizing agent. By selectively dissolving and removing the soluble resin and soluble organic filler contained in the embedding resin with an oxidizing agent, the surface of the embedding resin can be easily roughened to exert an anchoring, effect required to obtain a desired adhesion of wiring. As a result, even a wiring circuit board having a capacitor incorporated therein can be provided with minimized drop of reliability in adhesion of wiring also when a large current flows as in a power supply wiring formed on an embedding resin having a capacitor embedded therein.

Figure 1:
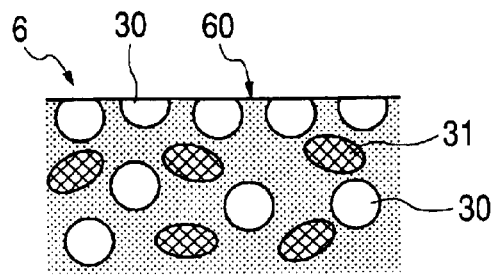
FIG. 1 is a diagram illustrating an embodiment of the embedding resin of the invention with reference to section in the vicinity of the smoothened surface thereof.

The reference numerals used in the drawings are shown below.

| | |
|---|---|
| 1 | Core substrate |
| 2 | Throughhole |
| 3 | Backing tape |
| 4 | Electronic part |
| 5 | Electrode of electronic part |
| 50 | Protrusion d of electrode of electronic part |
| 6 | Embedding resin |
| 60 | Smoothened surface |
| 61 | Roughened surface |
| 28 | Crack |
| 29 | Blister |
| 30 | Soluble component soluble with oxidizing agent |
| 31 | undissolved component substantially insoluble in oxidizing agent |
| 32 | Eluted portion |

DETAILED DESCRIPTION OF THE INVENTION

As the soluble resin which can be dissolved with an oxidizing agent there may be used a modified butadiene rubber to advantage because a good roughened surface can be obtained. In some detail, preferred among carboxyl group-containing acrylonitrile butadiene rubbers such as carboxyl group-terminated acrylonitrile butadiene rubber (CTBN), carboxyl group-containing acryl rubber, NBR, epoxy-modified butadiene, maleic acid-modified polybutadiene, etc. are liquid rubbers soluble in an oxidizing agent, which are particularly excellent in roughening properties.

As the soluble organic filler soluble with an oxidizing agent there may be used any known resin or organic filler soluble in an oxidizing agent. Preferred among butadiene rubber filler, crosslinked NBR filler, acryl resin filler, epoxy resin filler, etc. are organic fillers soluble in an oxidizing agent because these fillers can be adjusted in diameter to easily adjust the size of unevenness formed on the roughened surface.

The soluble resin and/or the soluble organic filler may be used in an amount of 1 to 30 wt %, preferably 1 to 20 wt %, more preferably 1 to 10 wt %, based on the embedding resin.

The diameter of the soluble organic filler to be used herein is preferably not greater than 50 μm because it is necessary that the embedding resin easily flow also through the gap between the electrodes of electronic parts. This is because when the diameter of the soluble organic filler exceeds 50 μm, the soluble organic filler can easily clog the gap between the electrodes of electronic parts, causing insufficient filling of embedding resin that produces portions having locally different thermal expansion coefficients. The diameter of the soluble organic filler is preferably not greater than 30 μm, more preferably not greater than 20 μm, even more preferably not greater than 10 μm. Further, when the embedding resin is polished to smoothen the surface thereof, the soluble organic filler is removed to produce a great unevenness that prevents the subsequent formation of a fine wiring by plating. The lower limit of the diameter of the soluble organic filler is preferably not smaller than 0.1 μm. When the diameter of the soluble organic filler falls below this limit, the fluidity of the embedding resin can be difficultly secured. The lower limit of the diameter of the soluble organic filler is more preferably not smaller than 0.3 μm, even more preferably not smaller than 0.5 μm.

As the undissolved component which is not substantially dissolved in an oxidizing agent there is preferably contain at least one of liquid epoxy resin and inorganic filler. In addition to its effect of adjusting the thermal expansion coefficient, these undissolved components can prevent the embedding resin which has been roughened from being out of shape more than required by the effect of the skeleton of three-dimensional structure of the epoxy resin which has hardened or the effect of the inorganic filler as an aggregate.

The epoxy resin may be used in an amount of 5 to 45 wt %, preferably 5 to 25 wt %, based on the embedding resin.

The inorganic filler may be used in an amount of 45 to 85 wt %, preferably 50 to 75 wt %, more preferably 60 to 75 wt %, based on the embedding resin.

Taking into account the fluidity of the embedding resin, a liquid epoxy resin is preferably used as an essential additive. This is because a liquid epoxy resin has a low viscosity itself and thus allows the incorporation of a filler component such as inorganic filler required to lower the thermal expansion coefficient of the embedding resin to a high percent filling.

As the liquid epoxy resin there is preferably used a bisphenol type epoxy resin. This is because a bisphenol type epoxy resin exhibits an excellent reliability (particularly in heat resistance) as compared with alkylmonoglycidyl ether or alicyclic epoxy resin, etc. A semi-solid epoxy resin is preferably additionally used so far as the working efficiency cannot be impaired. Preferred examples of the semi-solid epoxy resin include phenol novolak resin, naphthalene resin, etc. Particularly preferred among these resins is naphthalene resin. This is because naphthalene resin is excellent particularly in heat resistance and moisture resistance.

On the other hand, when only the semi-solid epoxy resin is used, the resulting embedding resin exhibits a raised viscosity. Therefore, the filler component such as inorganic filler required to lower the thermal expansion coefficient of the embedding resin cannot be added to a high percent filling. In order to obtain the same viscosity and percent filling as obtained in the case where the liquid epoxy resin is used, the addition of a volatile solvent is needed. However, the addition of a volatile solvent can cause the generation of foams in the embedding resin attributed to residual solvent to disadvantage.

The inorganic filler which is not substantially dissolved in an oxidizing agent is not specifically limited but is preferably a crystalline silica, molten silica, alumina, silicon nitride or the like. By adding such an inorganic filler as a filler to a high percent filling so that the thermal expansion coefficient of the embedding resin is not greater than 40 ppm/° C. (preferably not greater than 30 ppm/° C., more preferably not greater than 25 ppm/° C., even more preferably not greater than 20 ppm/° C., the lower limit being not smaller than 10 ppm/° C.), the concentration of stress attributed to the difference in thermal expansion coefficient between the embedded electronic part and the mounted semiconductor element can be minimized.

The shape of the inorganic filler is preferably substantial sphere to enhance the fluidity and percent filling of the embedding resin. A silica-based inorganic filler is particularly preferred because it is easily available in spherical form. In order to further lower the viscosity and enhance the percent filling of the embedding resin, it is preferred that two or more inorganic fillers having different particle shapes be added.

The particle diameter of the inorganic filler to be used herein is preferably not greater than 50 $\mu$m because the embedding resin needs to flow through the gap between the electrodes of the electronic parts. The particle diameter of the inorganic filler is preferably not greater than 30 $\mu$m, more preferably not greater than 20 $\mu$m, even more preferably not greater than 10 $\mu$m. When the particle diameter of the inorganic filler exceeds 50 $\mu$m, the resulting filler can easily clog the gap between the electrodes of the electronic parts, causing insufficient filling of embedding resin that produces portions having locally different thermal expansion coefficients. Further, when the embedding resin is polished to smoothen the surface thereof, the filler is removed to produce a great unevenness that prevents the subsequent formation of a fine wiring by plating. The lower limit of the diameter of the inorganic filler is preferably not smaller than 0.1 $\mu$m. When the diameter of the inorganic filler falls below this limit, the embedding resin can be difficultly provided with a desired fluidity. The lower limit of the diameter of the inorganic filler is more preferably not smaller than 0.3 $\mu$m, even more preferably not smaller than 0.5 $\mu$m. In order to lower the viscosity and enhance the percent filling of the embedding resin, the distribution of particle size may be expanded.

The surface of the inorganic filler is preferably subjected to surface treatment with a coupling agent as necessary. This is because the wettability of the inorganic filler by the resin component can be enhanced to improve the fluidity of the embedding resin. Examples of the coupling agent employable herein include silane-based coupling agent, titanate-based coupling agent, and aluminate-based coupling agent.

Other examples of the undissolved component which is not substantially dissolved in an oxidizing agent include modifiers such as hardening accelerator (curing accelerator), silicone oil, reactive silicon gel, reactive diluent and antifoaming agent.

The curing accelerator may be used in an amount of 0.02 to 3.5 wt % based on the embedding resin.

In the case where the embedding resin comprises a heat-curing resin incorporated therein, it is necessary that a hardening agent (curing agent) be added thereto. The kind of the hardening agent to be used herein is not specifically limited. In practice, however, an imidazole-based hardening agent, an amine-based hardening agent, an acid anhydride-based hardening agent, a novolak resin-based hardening agent or the like is preferably used. In particular, in the case where an epoxy resin is used as a heat-curing resin, when a liquid hardening agent such as imidazole, amine and acid anhydride is used, the resulting embedding resin can be easily provided with a lowered viscosity, making it favorable for adding a filler such as inorganic filler.

The curing agent may be used in an amount of 5 to 45 wt %, preferably 5 to 25 wt %, based on the embedding resin, The wiring circuit board having the gap between the electronic part disposed in the opening formed therein and the opening filled with the embedding resin or the invention can effectively relax the concentration of stress attributed to the difference in thermal expansion coefficient between the constituent members and thus exhibits an excellent reliability. In order to fill the gap between the electronic part disposed in the opening of the wiring circuit board and the opening with the embedding resin of the invention, any known injection method or coating method such as injection method using a dispenser, screen printing method and roll coating method may be used.

Figure 3:
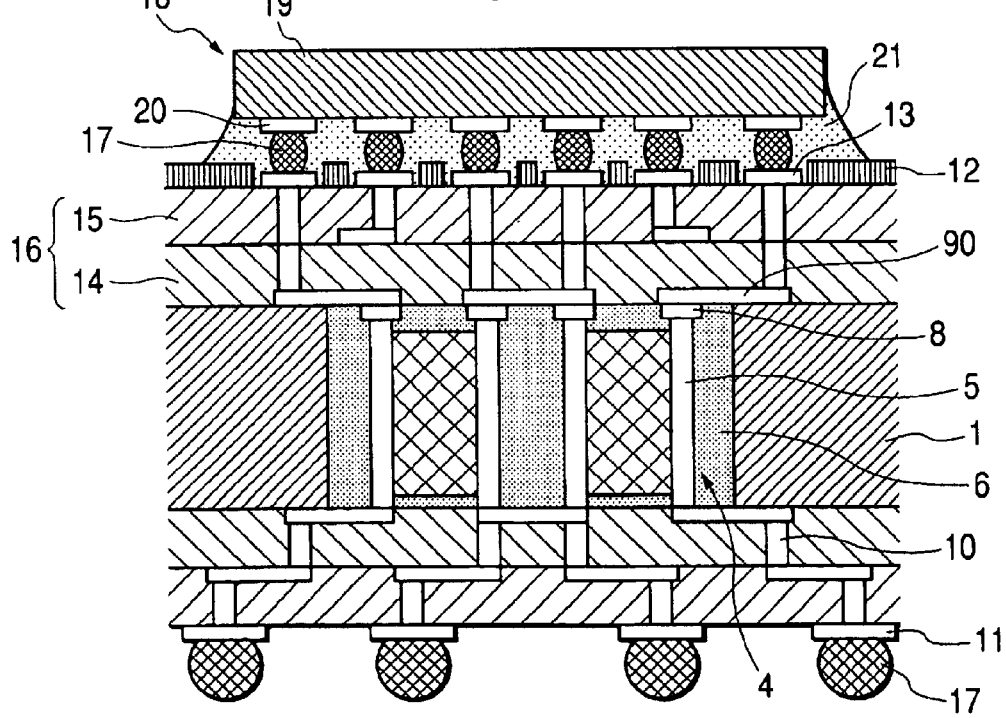
FIG. 3 is a diagram illustrating an example of the application of the wiring circuit board of the invention to BGA substrate.
Figure 14:
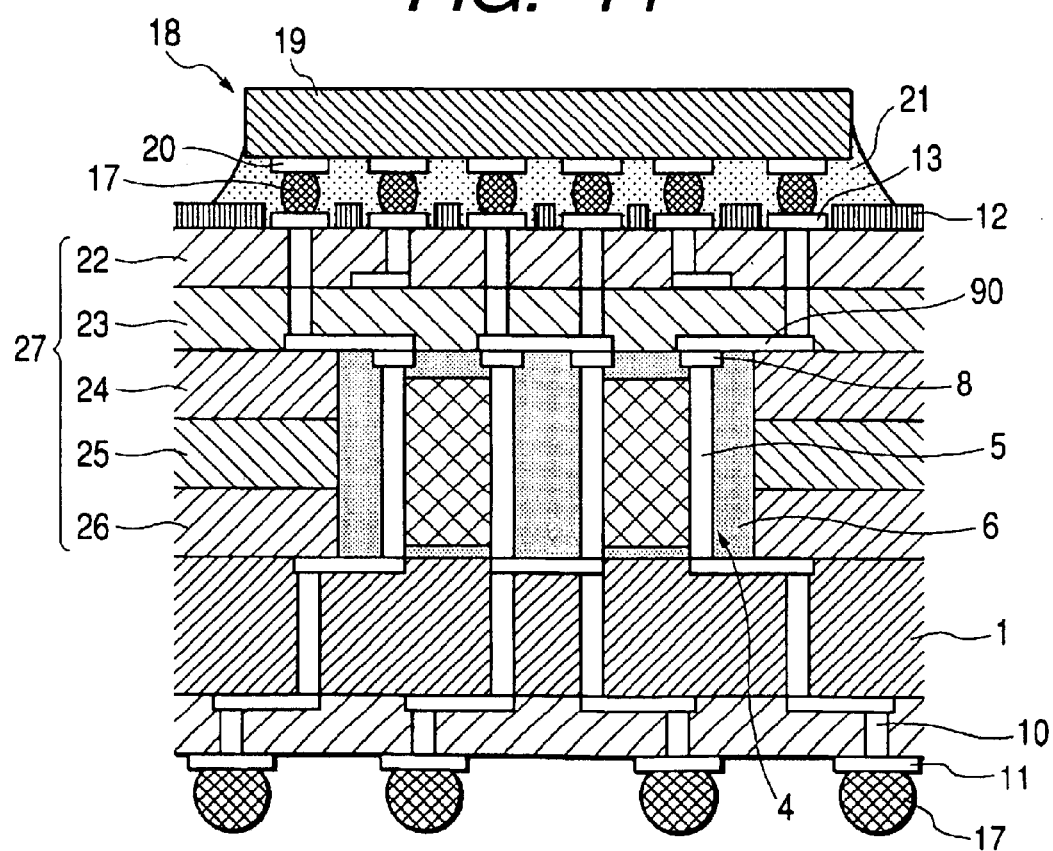
FIG. 14 is a diagram illustrating an example of the application of the wiring circuit board of the invention to BGA substrate.
Figure 15:
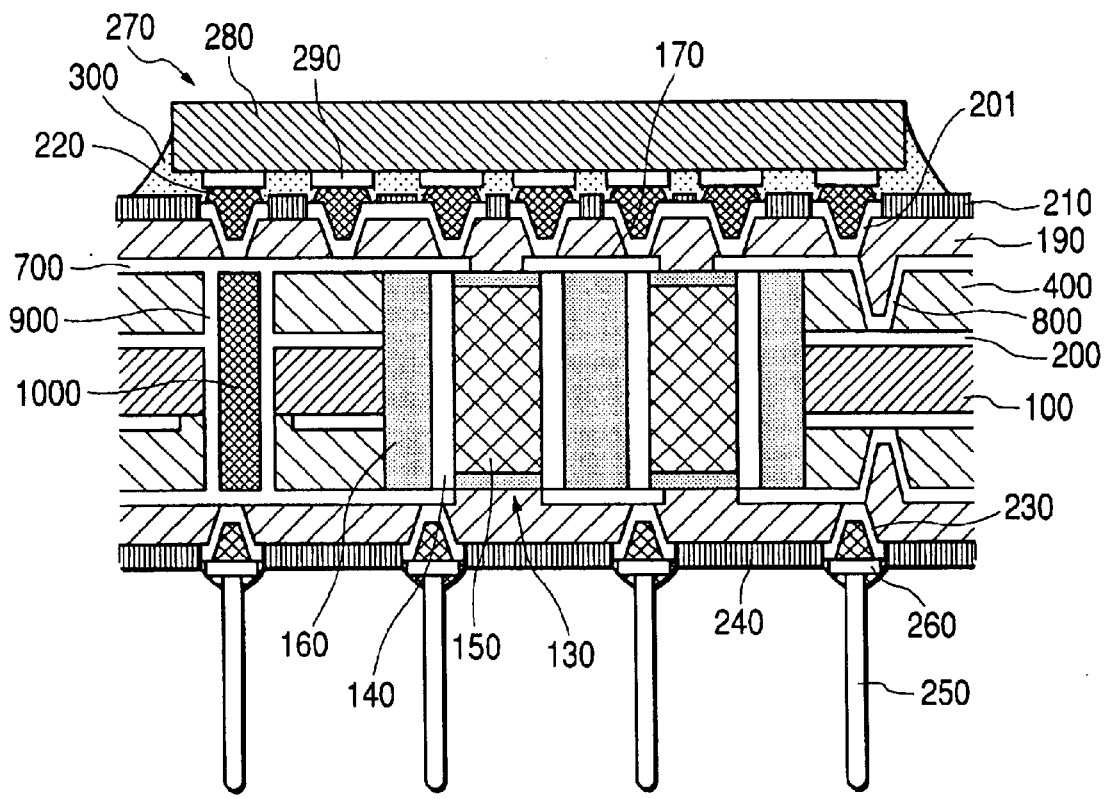
FIG. 15 is a diagram illustrating a semiconductor device comprising an FC-PGA type multi-layer printed circuit board as an embodiment of implication of the invention.

As the opening there may be used a throughhole punched in the substrate, a cavity formed by a multi-layer technique or the like. As the substrate there may be used a so-called core substrate such as FR-4, FR-5 and BT. A substrate obtained by forming an opening in a core substrate formed by clamping a thermoplastic resin sheet such as PTFE by copper foils having a thickness as great as about 35 $\mu$m maybe used. Alternatively, a substrate obtained by forming a build-up layer made of an alternate laminate of an insulating layer and a wiring layer on at least one side of a core substrate and forming an opening through the core substrate and the build-up layer. In this arrangement, even a capacitor-incorporated multi-layer wiring circuit board as shown in FIG. 15 is advantageous in that the thickness of the so-called glass-epoxy composite material (insulating substrate) can be reduced to about 400 $\mu$m, which is half that of ordinary products (800 $\mu$m), to reduce the height thereof. Further, a capacitor-incorporated substrate is advantageous in that the drop of reliability in adhesion of wiring can be prevented when a large current flows as in a power supply wiring formed on an embedding resin having a capacitor embedded therein. Referring to other examples, a wiring circuit board having an electronic part embedded in a core substrate (ex. FIG. 3) or a wiring circuit board embedded in a build-up layer (ex. FIG. 14) may be formed.

The wiring circuit board of the invention, the embedding resin may be roughened at least on the surface thereof which comes in contact with the wiring. This is because a fine unevenness on the roughened surface exerts an anchoring effect of enhancing the adhesion of the embedding resin to the wiring formed by electroless plating. The roughened surface is preferably adjusted to have a surface roughness $R_z$ of from 0.1 $\mu$m to 15 $\mu$m, more preferably from 0.5 $\mu$m to 10 $\mu$m, even more preferably from 1 $\mu$m to 8 $\mu$m, still more preferably from 3 $\mu$m to 7 $\mu$m, particularly from 5 $\mu$m to 7 $\mu$m. The wiring preferably is substantially caught by the fine unevenness on the roughened surface. This is because when there is a minute gap or defective adhesion portion where the wiring is not substantially caught by the unevenness, wiring blister can easily occur in the reliability test.

Figure 6:
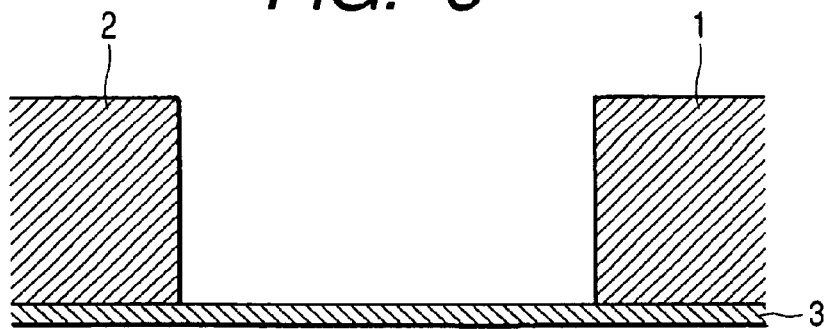
FIG. 6 is a diagram illustrating an embodiment of the process for producing the wiring circuit board of the invention.
Figure 7:
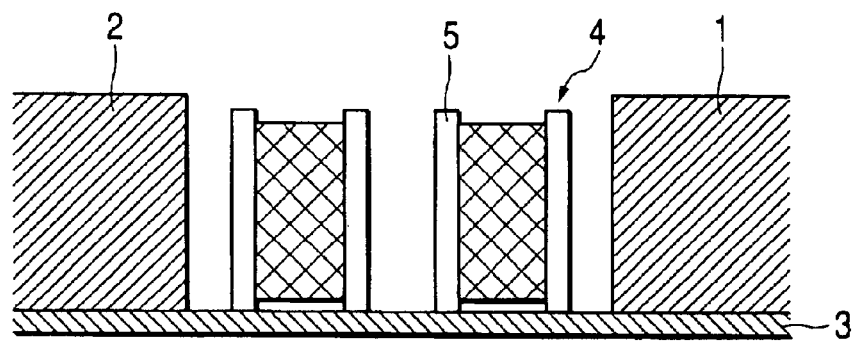
FIG. 7 is a diagram illustrating another embodiment of the process for producing the wiring circuit board of the invention.

The wiring circuit board of the invention is preferably produced, e.g., in the following manner (FIG. 3 and FIGS. 6 to 13). FIG. 3 illustrates an example of the application of the wiring circuit board of the invention to BGA substrate. Firstly, a core substrate (1) is punched by a mold press to form an opening (2) having a predetermined shape. As shown in FIG. 6, a backing tape (3) is applied to one side of the core substrate to prevent the leakage of an embedding resin. The core substrate is then disposed with the backing tape side thereof facing downward. As shown in FIG. 7, electronic parts (4) are then inserted into the opening from the other side and disposed in position on the adhesive side of the backing tape is in the opening using a chip mounter.

Figure 8:
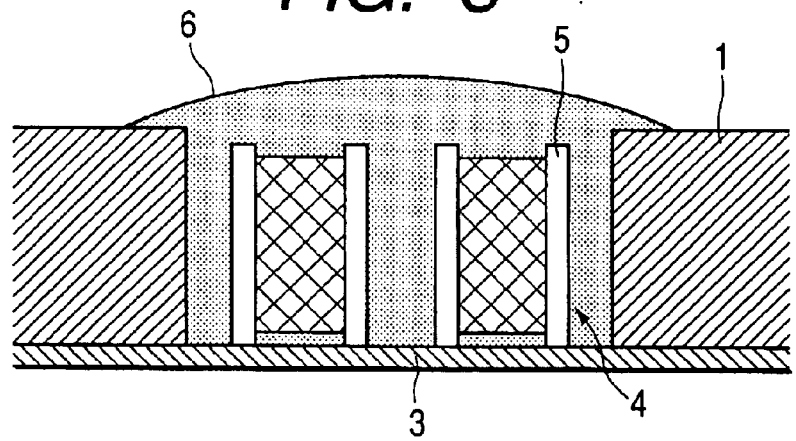
FIG. 8 is a diagram illustrating other embodiment of the process for producing the wiring circuit board of the invention.

As shown in FIG. 8, the gap between the electronic parts disposed in the opening and the wall of the opening is filled with an embedding resin (6) of the invention using a dispenser. In the case where an epoxy resin is used, the substrate is heated to a temperature of from 110° C. to 180° C. to heat-cure the embedding resin. The heat curing is preferably effected by two stages, i.e., primary heating step effected at a temperature of from 80° C. to 120° C. and secondary heating step effected at at temperature of from 120° C. to 180° C. This is because the primary heating step allows the effective removal of foams caught in the gap between the electronic parts and the wall of the opening and between the electrodes and the secondary heating step then allows curing of the embedding resin in a good state free of foams.

Figure 9:
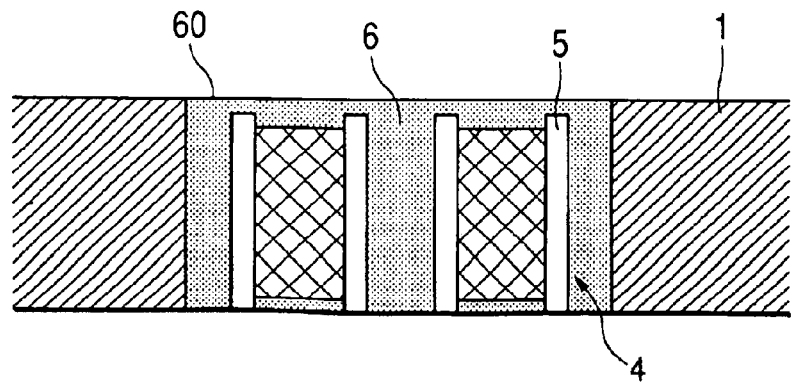
FIG. 9 is a diagram illustrating a further embodiment of the process for producing the wiring circuit board of the invention.
Figure 10:
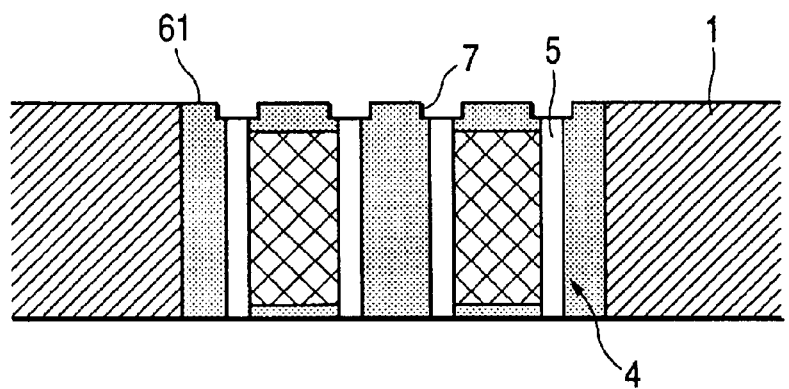
FIG. 10 is a diagram illustrating a still further embodiment or the process for producing the wiring circuit board of the invention.

As shown in FIG. 9, the surface of the embedding resin thus cured is then subjected to rough polishing with a belt sander and finish polishing by lap polishing so that it is smoothened to form a smoothened surface (60). As shown in FIG. 10, the surface of the embedding resin is then irradiated with carbon dioxide gas laser or YAG laser so that it is partly removed to form a via hole (7) for conduction such that the electrode of the electronic parts embedded in the embedding resin is exposed. This is to draw a wiring from the electrode of the electronic parts.

The roughening of the smoothened surface (60) of the embedding resin is carried out by a roughening step using an oxidizing agent. As the oxidizing agent to be used in the roughening step there may be used any known oxidizing agent such as a permanganate-based oxidizing agent (e.g., $KMnO_4$, $HMnO_4$), chromate-based oxidizing agent (e.g., $CrO_3$, $K_2Cr_2O_7$, $K_2CrO_4$, $KCrO_3Cl$, $CrO_2Cl_2$), nitrate-based oxidizing agent (e.g., $HNO_3$, $N_2O_4$, $N_2O_3$, $N_2O$, Cu $(NO_3)_2$, Pb $(NO_3)_2$, $AgNO_3$, $KNH_4NO_3$), halogen-based oxidizing agent (e.g., $F_2$, $Cl_2$, $Br_2$, $I_2$), peroxide-based oxidizing agent (e.g., $H_2O_2$, $Na_2O_2$, $BaO_2$, $(C_6H_5CO)_2O_2$), peracid-based oxidizing agent (e.g., $Na_2S_2O_8$, $Na_2SO_5$, $K_2S_2O_8$, $K_2SO_5$, $HCO_3H$, $CH_3CO_3H$, $C_6H_5CO_3H$, $C_6H_4(COOH)CO_3H$, $CF_3CO_3H$), sulfate-based oxidizing agent (e.g., hot concentrated sulfuric acid, fuming sulfuric acid+concentrated nitric acid), oxygen acid-based oxidizing agent (e.g., KClO, NaClO, KBrO, NaBrO, KIO, NaIO, $KClO_3$, $NaClO_3$, $KBrO_4$, $NaBrO_4$, $KIO_4$, $NaIO_4$, $HIO_4$, $Na_2N_2IO_6$), metallic oxidizing agent (e.g., $FeCl_3$, $CuSO_4$, $Cu(CH_3COO)_2$, $CuCl_2$, $Hg(CH_3COO)_2$, $Bi(CH_3COC)_3$, $Pb(CH_3COO)_4$), oxygen-based oxidizing agent (e.g., air, oxygen, ozone) and oxide-based oxidizing agent (e.g., $CeO_2$, $Ag_2O$, CuO, HgO, $PbO_2$, $BisO_3$, $OsO_4$, $RuO_4$, $SeO_2$, $MnO_2$, $As_2O_5$). In particular, a mixed oxidizing agent such as alkali-permanganate-based oxidizing agent, chromate-sulfate-based oxidizing agent, chromate-sulfate-sodium fluoride-based oxidizing agent and borofluorate-bichromate-based oxidizing agent is preferably used because it can fairly roughen an embedding resin mainly composed of epoxy resin.

Figure 2:
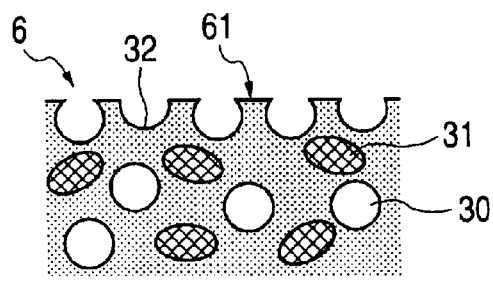
FIG. 2 is a diagram illustrating another embodiment of the embedding resin of the invention with reference to section in the vicinity of the roughened surface thereof.

FIGS. 1 and 2 each are a sectional view of a portion close to the polished surface of the embedding resin before and after roughening, respectively. The soluble resin or soluble organic filler as components (30) which can be dissolved with an oxidizing agent contained in the embedding resin (6) are dissolved away with an oxidizing agent to form an eluted portion (32). Thus, a roughened surface (61) made of minute unevenness is formed on the exposed surface of the embedding resin. The unevenness exerts an anchoring effect, making it possible to provide the embedding resin with a desired adhesion to the wiring subsequently formed by an electroless plating or electrolytic plating process. It is preferred that the embedding resin comprise a liquid epoxy resin or inorganic filler incorporated therein as an undissolved component (31) which is not substantially dissolved in an oxidizing agent to adjust the thermal expansion coefficient thereof or prevent itself from being out of shape more than required after roughening.

Figure 11:
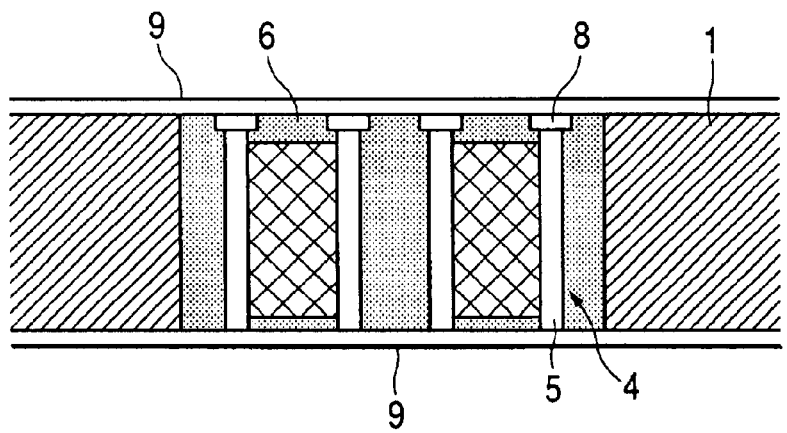
FIG. 11 is a diagram illustrating a still further embodiment of the process for producing the wiring circuit board of the invention.

The roughened surface (61) is activated with a chemical containing a palladium chloride solution, and then electrolessly plated with copper (not shown). Subsequently, the roughened surface (61) is electrolytically plated with copper to form a panel deposit (panel plating layer) (9) as shown in FIG. 11. Since the via hole (7) is filled with copper at the plating step to form a via conductor (8) as shown in FIG. 11, electrical connection to the electrode of the electronic parts can be made.

Figure 12:
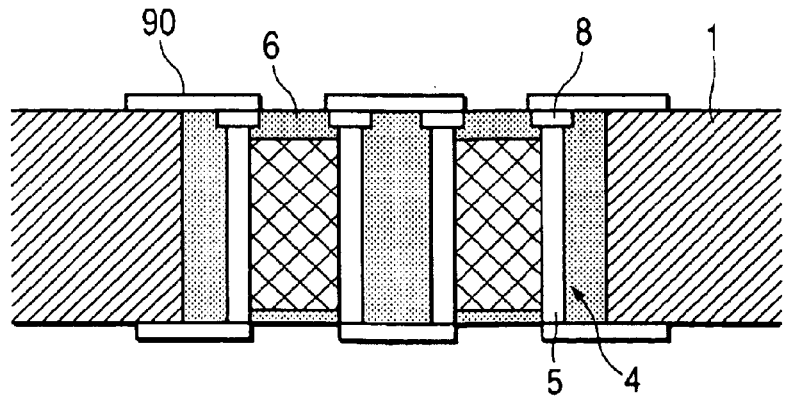
FIG. 12 is a diagram illustrating a still further embodiment of the process for producing the wiring circuit board of the invention.
Figure 13:
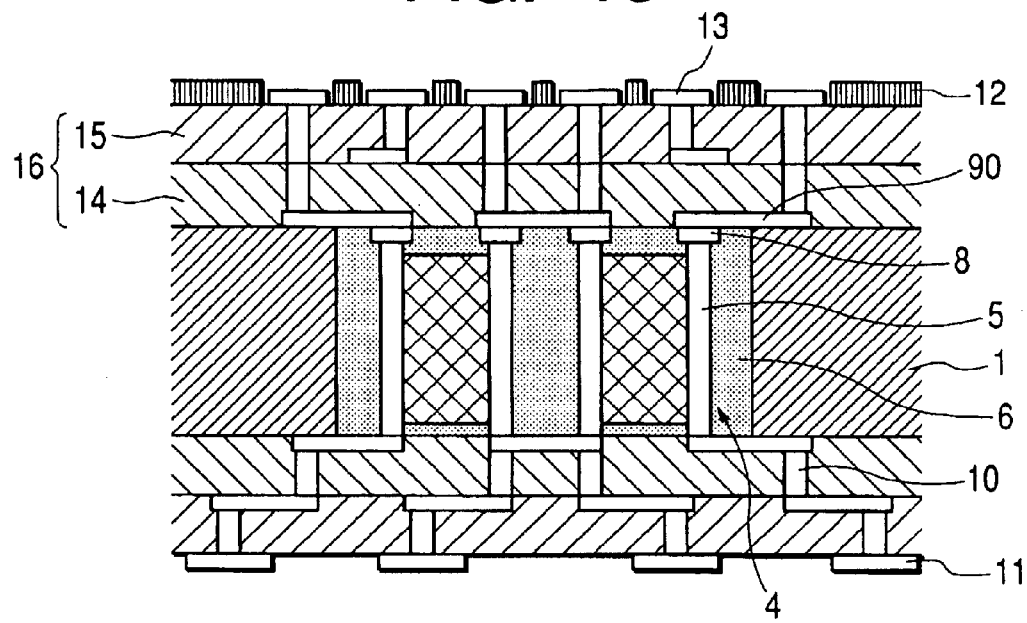
FIG. 13 is a diagram illustrating a still further embodiment of the process for producing the wiring circuit board of the invention.

A dry film is then stuck to the panel deposit (9). The dry film is exposed to light through a predetermined wiring pattern, and then developed (not shown). The panel deposit (9) is then removed with an etching solution containing $Na_2S_2O_8/H_2SO_4$ on the area unnecessary for wiring to form a predetermined wiring (90) as shown in FIG. 12. Subsequently, a known build-up technique may be used as necessary to make a multi-layer structure as shown in FIG. 13. FIG. 14 illustrates an example of the application of the wiring circuit board of the invention to BGA substrate. A solder ball (17) for PCB mounting is formed on a land pad (11). A solder paste is previously printed on a mounting pad (13) which is then subjected to solder reflow to form a solder bump (17) thereon. On the surface of the wiring circuit board on which a semiconductor element is mounted is formed a solder resist (12) to prevent the short circuiting of the terminal electrodes of the semiconductor due to leaking solder. The semiconductor element (18) is connected to the solider bump (17) through the terminal electrode (20) provided on the mounting surface of the semiconductor (18). The mounting portion is filled with an under filling material (21) to relax stress.

The formation of the wiring can be accomplished by any known wiring forming method such as subtractive method and additive method (e.g., semi-additive method, full-additive method). It is important that the interior of the via hole for conduction which has been formed by laser to cause the electrode of the electronic parts to be exposed is filled with an electrically-conductive deposit or electrically-conductive paste to secure conduction between the layers.

As the substrate to be used herein there may be used a glass-epoxy composite substrate such as FR-5, BT (bismaleimide-triazine resin) substrate or the like. Besides using the exemplified core substrate obtained by panel plating after roughening, a copper-clad core substrate which has previously been clad with a copper foil may be used to accomplish the object of the invention. The thickness of the substrate is not specifically limited but is preferably almost equal to or slightly greater than that of the electronic parts. In the case where a multi-layer wiring circuit board is produced, an insulating layer to be used in known build-up method or laminate method may be used. A heat-curing resin, a thermoplastic resin, a photosensitive resin or mixture or modification product thereof may be used. Specific examples of these resins include epoxy resin such as bisphenol type epoxy resin and novolak type epoxy resin, epoxy acrylate resin, teflon resin, liquid crystal polymer, PPS resin, and PPE resin.

Figure 5:
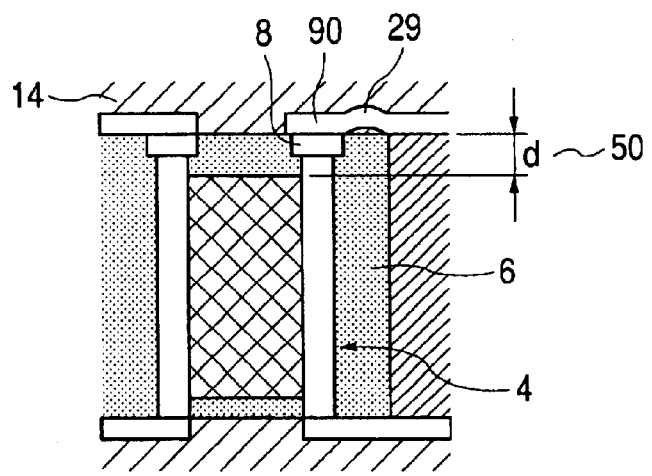
FIG. 5 is a diagram illustrating an example of the state of wiring blister generated on the interface with the embedding resin.

Examples of the electronic parts include chip resistor, chip capacitor, and chip inductor. These electronic parts are preferably in ceramic-laminated form because they can exhibit a sufficient capacity even in a small-sized form. The protrusion d (reference numeral 50 in FIG. 5) extending from the surface of the ceramic material of the electrode of the electronic parts embedded in the embedding resin to the surface of the embedding resin is preferably from 20 $\mu$m to 150 $\mu$m at least one the side of the substrate on which the semiconductor is mounted. Preferably, the protrusion d is from 20 $\mu$m to 150 $\mu$m for the electrodes on the both sides of the electronic parts. This is because the embedding resin can fairly flow through the gap between the electrodes on the both sides of the electronic parts. When the electrode protrusion falls below this range, the filler in the embedding resin is caught by the gap, making it difficult to fill the gap. On the contrary, when the electrode protrusion exceeds this range, the resulting stress causes the electrodes themselves to be easily peeled to disadvantage in reliability.

The electrode protrusion is preferably from 30 $\mu$m to 100 $\mu$m, more preferably from 50 $\mu$m to 80 $\mu$m. This is because a filler having a relatively large particle diameter can be added to improve the fluidity of the embedding resin itself, making it possible for the embedding resin to flow through the gap between the wall of the opening and the electronic parts extremely fairly.

The surface of the electrode of the electronic parts has a roughness of from 0.3 $\mu$m to 20 $\mu$m, preferably from 0.5 $\mu$m to 10 $\mu$m, more preferably from 0.5 $\mu$m to 5 $\mu$m. This is because the embedding resin can be caught by the unevenness on the surface of the electrode to exert an anchoring effect of enhancing the adhesion therebetween. The process for controlling the roughness $R_z$ is not specifically limited. Any known method such as microetching and blackening may be employed.

The wiring circuit board of the invention allows a semiconductor to be mounted almost above the electronic parts and thus can be reduced in its area. For example, by embedding a chip capacitor in the wiring circuit board so that it is incorporated in the wiring circuit board to form a decoupling capacitor, the length of the wiring from the power supply layer and the grounding layer to the decoupling capacitor can be reduced to lessen extra inductance, making it possible to effectively reduce switching noise.

The term "almost above (substantially above)" as used herein is meant to indicate a concept containing not only the case where the semiconductor is disposed rightly above the electronic parts but also the case where the semiconductor is disposed rightly above only the periphery of the electrode of the electronic parts connected to the semiconductor. This is because when the electrode of the semiconductor and the electrode of the electronic parts are in position such that they are connected to each other almost vertically through the via conductor, the effect described in the foregoing paragraph can be obtained.

The multi-layer wiring circuit board comprising a substrate obtained by forming a build-up layer made of an alternate laminate of an insulating layer and a wiring layer on at least one side of a core substrate and forming an opening through the core substrate and the build-up layer may be produced, e.g., by the following method (FIGS. 15 to 29). The production method will be described hereinafter with reference to an embodiment of the so-called "FC-PGA" structure shown in FIG. 15.

Figure 16:
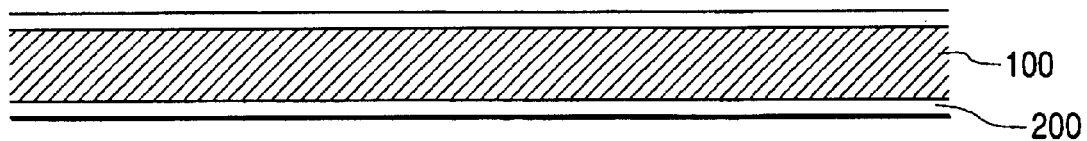
FIG. 16 is a schematic diagram illustrating a copper-clad core substrate having a thickness of 400 μm.

An FR-5 double-sided copper-clad core substrate having an insulating substrate (100) having a thickness of 0.4 mm clad with a copper foil (200) having a thickness of 18 $\mu$m as shown in FIG. 16 is prepared. Referring to the properties of the core substrate to be used herein. Tg (glass transition point) as determined by TMA is 175° C., CTE (coefficient of thermal expansion) along the surface of the substrate is 16 ppm/° C., CTE (coefficient of thermal expansion) in the direction perpendicular to the surface of the substrate is 50 ppm/° C., the dielectric constant $\epsilon$ at 1 MHz is 4.7, and tan $\delta$ at 1 MHz is 0.018.

Figure 17:
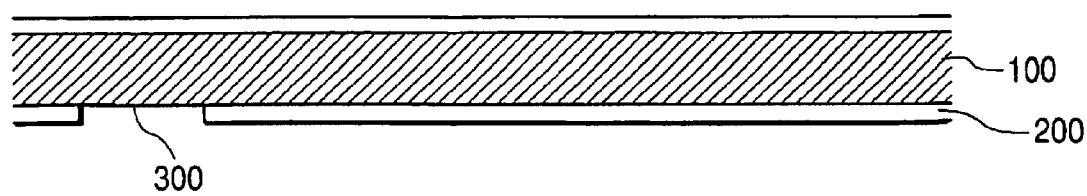
FIG. 17 is a diagram illustrating the state of a patterned copper-clad core substrate having a thickness of 400 μm.

The core substrate is exposed to light through a photoresist film which has been stuck thereto, and then developed to form an opening having a diameter of 600 $\mu$m and an opening (not shown) having a shape corresponding to the predetermined shape of the wiring. The copper foil exposed in the opening of the photoresist film is then etched away with an etching solution containing sodium sulfite and sulfuric acid. The photoresist film is then peeled off from the core substrate to obtain a core substrate having an exposed portion (300) as shown in FIG. 17 and an exposed portion (not shown) having a shape corresponding to the predetermined shape of the wiring formed thereon.

The core substrate is then subjected to etching using a commercially available etching device (CZ processing machine produced by MEC. Co.) so that the copper foil is roughened on the surface thereof. An insulating film having a thickness of 35 $\mu$m mainly composed of an epoxy resin is then stuck to both sides of the core substrate. The laminate is then subjected to curing at a temperature at 170° C. for 1.5 hours to form an insulating layer thereon. Referring to the properties of the insulating layer thus cured. Tg (glass transition point) as determined by TMA is 155° C., Tg (glass transition point) as determined by DMA is 204° C., CTE (coefficient of thermal expansion) is 66 ppm/° C., the dielectric constant a at 1 MHz is 3.7, tan $\delta$ at 1 MHz is 0.033, the weight reduction at 300° C. is 10.1%, the water absorption is 0.8%, the hygroscopicity is 1%, Young's modulus is 3 GHz, the tensile strength is 63 MPa, and the percent elongation is 4.6%.

Figure 18:
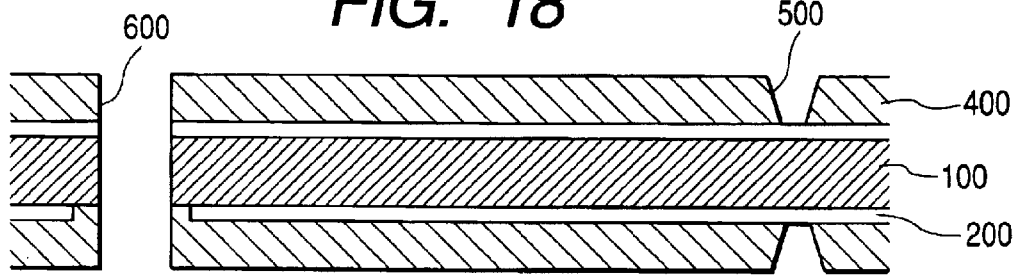
FIG. 18 is a diagram illustrating how a via hole and a through hole are formed in a core substrate having an insulating layer formed on both sides thereof.

As shown in FIG. 18, the substrate is irradiated with carbon dioxide gas laser beam to form a via hole (500) for interlayer connection in the insulating layer (400). The via hole is in the form of a cone having a diameter of 120 $\mu$m at the upper part thereof and 60 $\mu$m at the bottom thereof. By raising the output of carbon dioxide gas laser, a throughhole (600) having a diameter of 300 $\mu$m is formed through the insulating layer and the core substrate. The inner wall of the throughhole has an undulation (not shown) characteristic of laser processing. The substrate is dipped in a catalytical activating solution containing palladium chloride, and then subjected to electroless copper plating on the entire surface thereof (not shown).

Subsequently, the substrate is subjected to copper panel plating (700) to a thickness of 18 $\mu$m. In the via hole is formed a via conductor (800) for electrically connecting the layers. In the via hole is also formed a throughhole conductor (900) for electrically connecting between the surface and the other surface of the substrate. Using a commercially available etching device (CZ processing machine produced by MEC. Co.), the substrate is then subjected to etching so that the copper deposit is roughened on the surface thereof. Thereafter, the copper deposit is subjected to rust prevention treatment (trade name: CZ treatment) with a rust preventive produced by MEC. Co., LTD. to form a hydrophobicized surface and complete hydrophobicization. The contact angle 2θ of the hydrophobicized surface of the conductor layer with respect to water was then measured by a liquid dropping method using a contact angle meter (trade name: CA-A, produced by Kyowa Interface Science Co., Ltd.). As a result, the contact angle 2θ was 101°.

A non-fiber paper is then placed on a pedestal equipped with a vacuum suction apparatus. The foregoing substrate is then placed on the pedestal. A stainless steel hole-filling mask having throughholes in position corresponding to that of the throughholes is placed on the substrate. Subsequently, a paste for filling throughholes containing a copper filler is placed on the mask. The throughholes are then filled with the paste under pressure of a roller squeegee.

Figure 19:
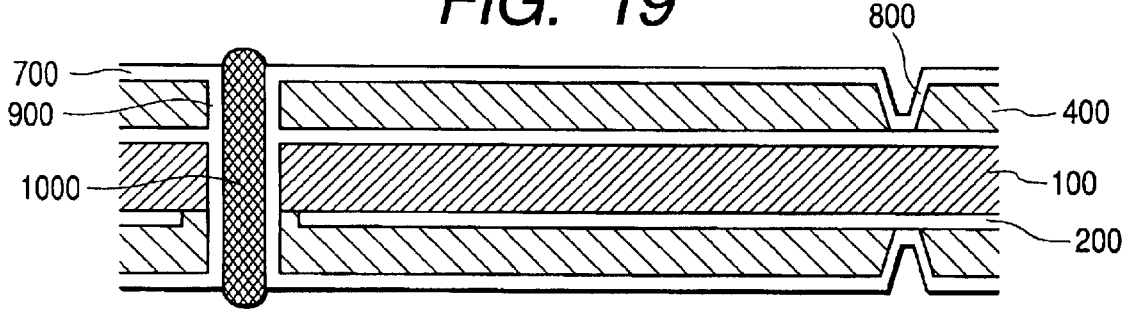
FIG. 19 is a diagram illustrating the state of the core substrate having an insulating layer formed on both sides thereof which has been panel-plated.
Figure 20:
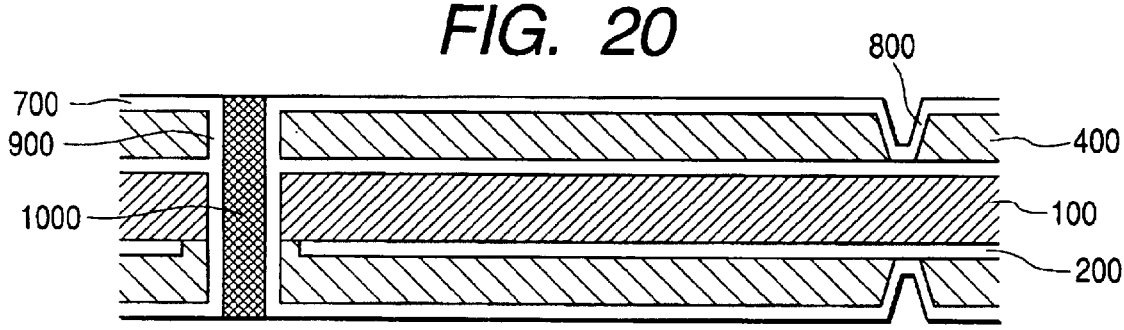
FIG. 20 is a diagram illustrating the substrate having its throughhole filled.

As shown in FIG. 19, the paste (1000) for filling throughholes packed in the throughholes is tentatively cured at a temperature of 120° C. for 20 minutes. Subsequently, as shown in FIG. 20, the surface of the core substrate is polished with a belt sander (rough polishing), and then subjected to buffing (finish polishing) so that it is smoothened (not shown). The paste is then cured at a temperature of 150° C. for 5 hours to complete the filling step. The substrate which has been completed in the filling step is partly used for evaluation test on filling properties.

Figure 21:
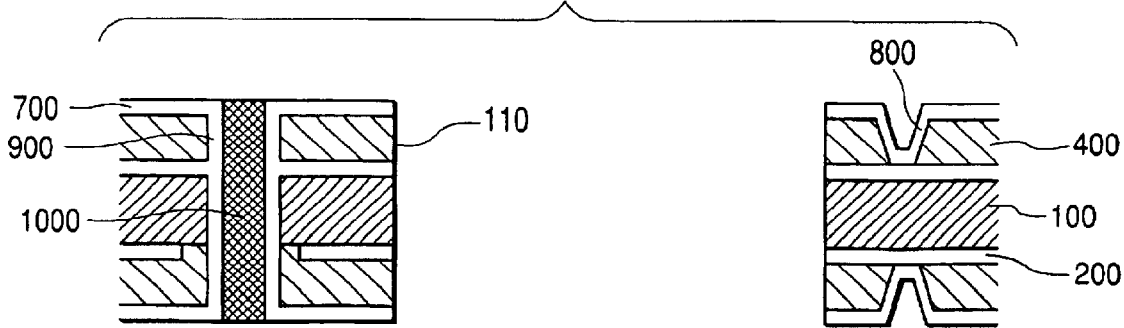
FIG. 21 is a diagram illustrating the substrate having a throughhole punched therein.
Figure 22:
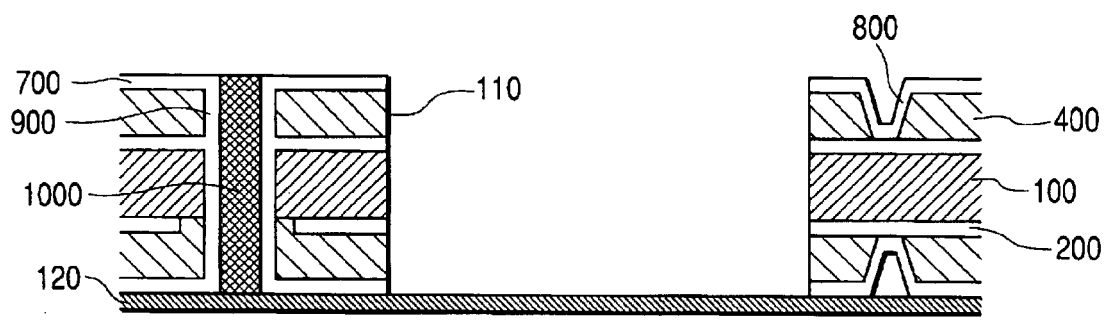
FIG. 22 is a diagram illustrating how a masking tape is stuck to one side of the substrate having a throughhole punched therein.
Figure 23:
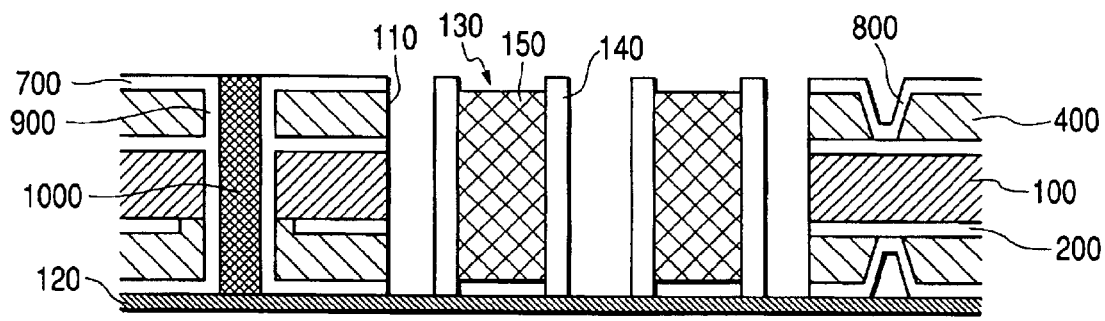
FIG. 23 is a diagram illustrating how laminated chip capacitors are disposed on the masking tape exposed in the throughhole.

As shown in FIG. 21, a throughhole (110) having a size of 8 mm square is formed using a mold (not shown). As shown in FIG. 22, a masking tape (120) is stuck to one side of the substrate. Subsequently, as shown in FIG. 23, 8 laminated chip capacitors (130) are placed on the masking tape exposed in the throughhole (110) using a chip mounter. These laminated chip capacitors each are each made of a laminated material (150) having a size of 1.2 mm×0.6 mm×0.4 mm. An electrode (140) protrudes from the laminated material by 70 μm.

Figure 24:
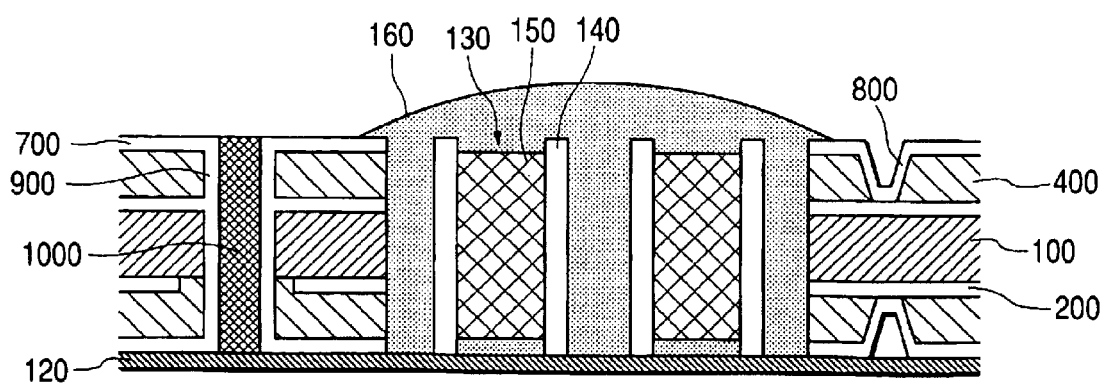
FIG. 24 is a diagram illustrating the throughhole filled with an embedding resin.

As shown in FIG. 24, the throughhole in which the laminated chip capacitors are disposed is filled with an embedding resin of the invention (160) using a dispenser (not shown). The embedding resin is subjected to primary heating step at a temperature of 80° C. for 3 hours and then to secondary heating at a temperature of 170° C. for 6 hours to undergo defoaming and heat curing.

Figure 25:
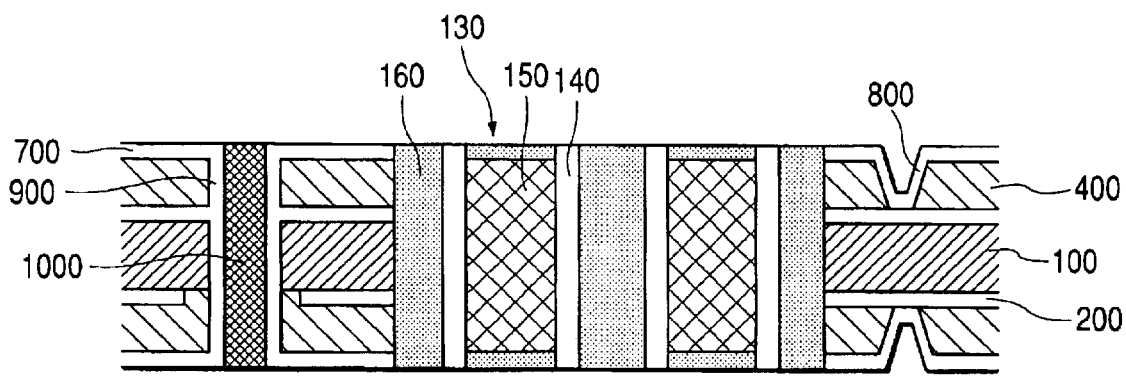
FIG. 25 is a diagram illustrating the substrate which has been polished to smoothen the surface thereof.

As shown in FIG. 25, the surface of the embedding resin thus cured is subjected to rough polishing with a belt sander and then to finish polishing by lap polishing. The end face of the electrode of the chip capacitor is exposed on the polished surface of the embedding resin. Subsequently, the embedding resin which has been tentatively cured is cured at a temperature of 150° C. for 5 hours.

Figure 26:
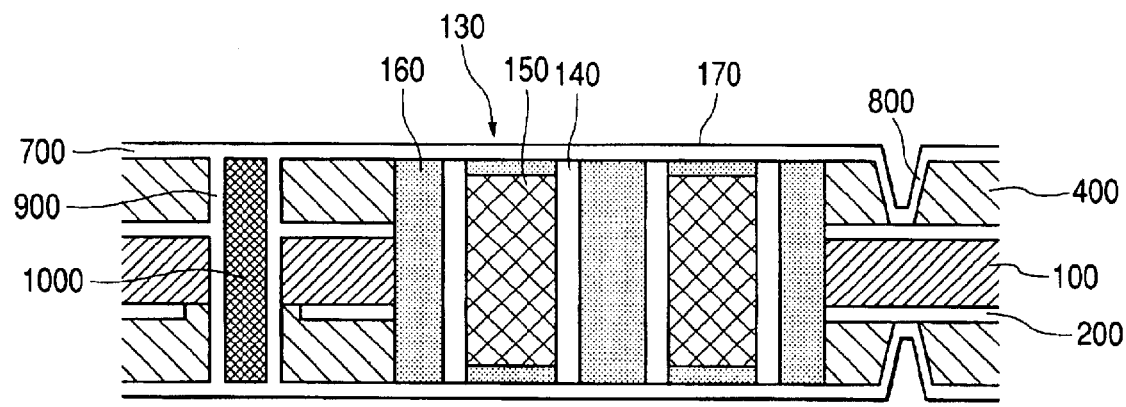
FIG. 26 is a diagram illustrating how the substrate is panel-plated on the polished surface thereof.
Figure 27:
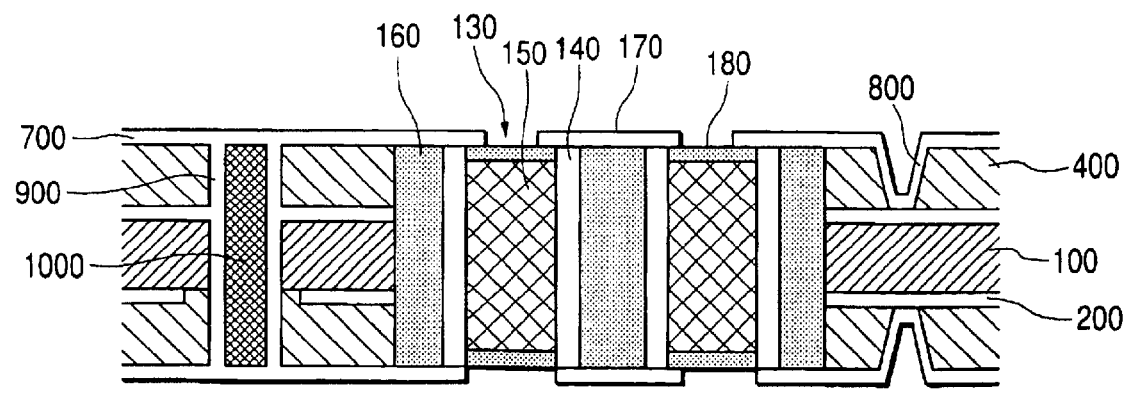
FIG. 27 is a diagram illustrating how a wiring patterning is made.

Thereafter, the polished surface of the embedding resin is subjected to roughening with a swelling solution and $KMnO_4$ solution. The roughened surface of the embedding resin is activated by a Pd catalyst, electrolessly plated with copper, and then electrolytically plated with copper. As shown in FIG. 26, the deposit formed on the embedding resin is electrically connected to the end face of the electrode of the chip capacitor. A resist is formed on the plated surface of the embedding resin. With this resist, a predetermined wiring pattern is formed on the plated surface of the embedding resin. The unnecessary copper is etched away with $Na_2S_2O_8$/concentrated sulfuric acid. The resist is peeled off from the embedding resin to complete the formation of a wiring as shown in FIG. 27. Using a commercially available etching device (CZ processing machine produced by MEC Co.), the embedding resin is then subjected to etching so that the copper-plated wiring is roughened on the surface thereof.

Figure 28:
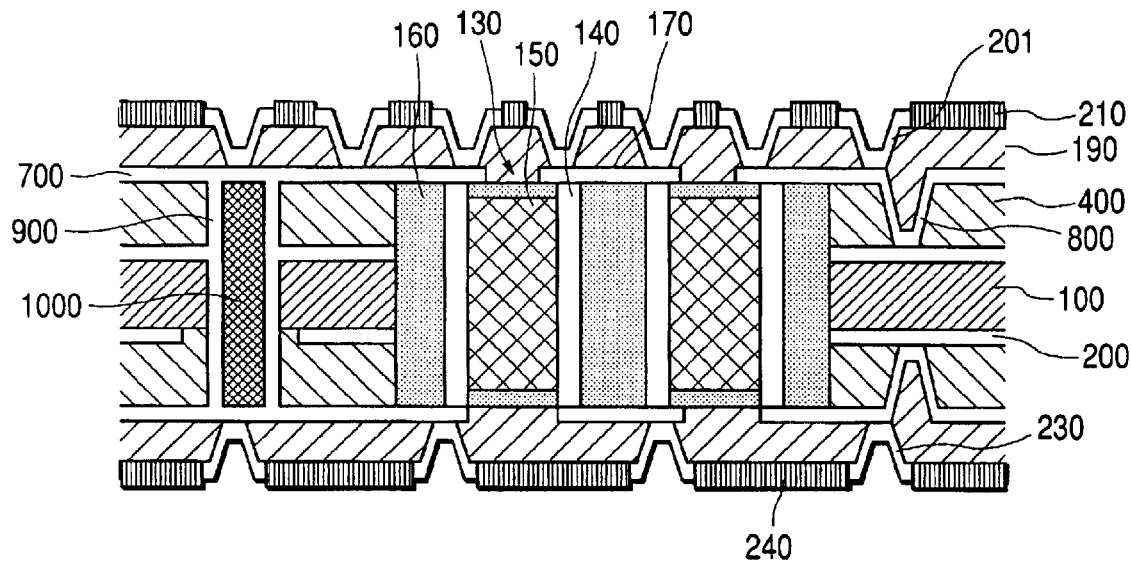
FIG. 28 is a diagram illustrating how a build-up layer and a solder resist layer are formed on the substrate.

A film (190) as an insulating film is laminated on the roughened surface of the copper-plated wiring, and then subjected to heat curing. The insulating film is irradiated with carbon dioxide gas laser beam to form a via hole for interlayer connection therein. The surface of the insulating layer is then roughened with the same oxidizing agent as used above. A predetermined wiring (201) is formed in the same manner as mentioned above. A dry film as a solder resist layer is then laminated on the uppermost layer of the wiring circuit board. The dry film is exposed to light through a semiconductor element mounting pattern, and then developed to complete the formation of a solder resist layer (210). A predetermined wiring (230) and a solder resist layer (240) are formed also on the surface of the wiring circuit board on which mounting pins are mounted to obtain a multi-layer printed circuit board unprovided with pins as shown in FIG. 28.

The terminal electrode (201) on which a semiconductor is mounted is plated with Ni and then with Au (not shown). A solder paste made of a low melting solder is then printed on the wiring circuit board. The wiring circuit board is then passed through a solder reflow furnace to form a solder bump (220) for mounting a semiconductor.

Figure 29:
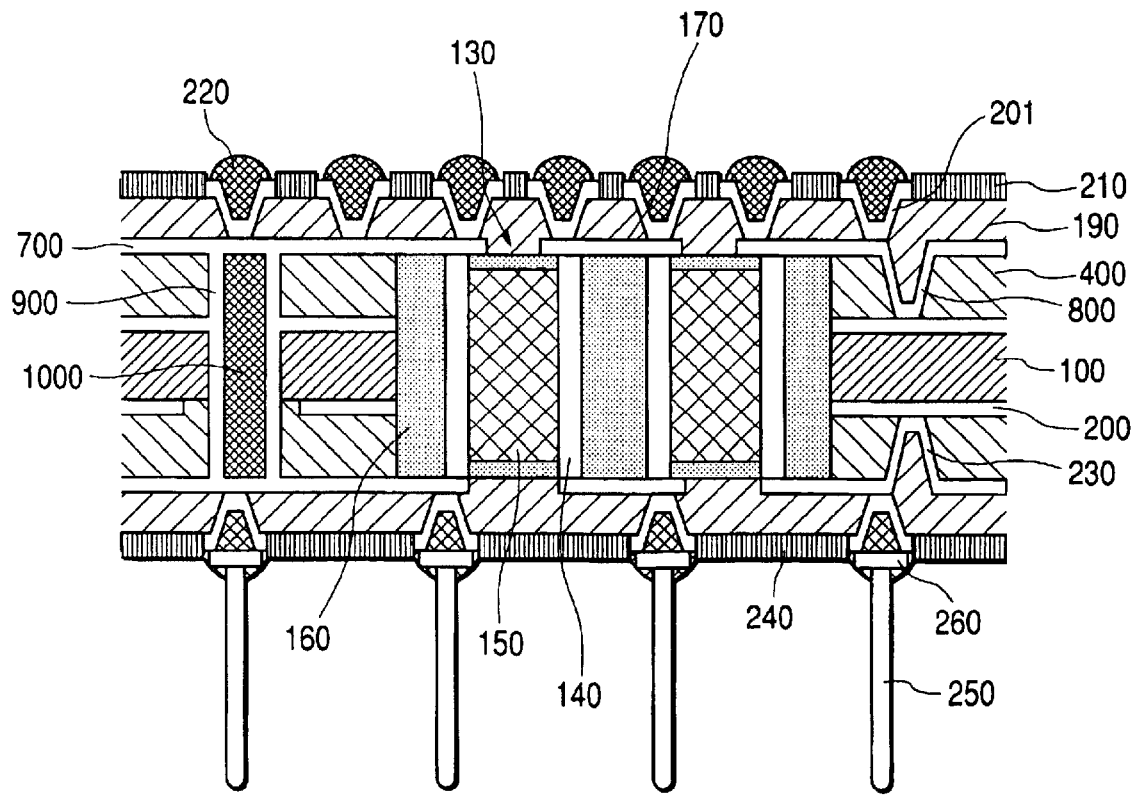
FIG. 29 is a diagram illustrating an FC-PGA type multilayer printed circuit board as an embodiment of implication of the invention.

On the other hand, a solder paste made of a high melting solder is printed on the surface of the wiring circuit board opposite the surface on which semiconductors are mounted. The wiring circuit board is then passed through a solder reflow furnace to a solver bump (260) for mounting pins. The wiring circuit board is then passed through a solder reflow furnace while being placed on pins (250) mounted on a fixture (not shown) to mount pins thereon (not shown). Thus, as shown in FIG. 29, an FC-PGA type multi-layer printed circuit board which is ready to for mounting of semiconductor elements is obtained. Using a projector, the deviation of the position of the forward end of the pins mounted in the region corresponding to the opening filled with the embedding resin from the predetermined position was measured. The results were as good as not greater than 0.1 mm. Even when subjected to repeated energization with a large current, the wiring for power supply formed on the embedding resin underwent no defectives such as peeling.

Semiconductor elements (270) are disposed on the mounting surface of the wiring circuit board in a mountable position. The wiring circuit board is then passed through a solder reflow furnace under temperature conditions at which only a low melting solder is melted to mount the semiconductor elements therein. The mounted portion is then filled with an underfilling material using a dispenser. The underfilling material is then heat-cured to obtain a semiconductor device comprising an FC-PAG type multi-layer printed circuit board having semiconductor elements mounted therein as shown in FIG. 15.

The invention will be further described in the following examples. The embedding resin was prepared by measuring the various components such that the formulation set forth in Table 1 was attained, mixing them, and then kneading the mixture by means of a three-roll mill. The details of the description in Table 1 are as follows.

Epoxy Resin
"Liquid BPA": Bisphenol A type epoxy resin (YL980, produced by Japan Epoxy Resins Co., Ltd.)
"Liquid BPF": Bisphenol F type epoxy resin (YL983U, produced by Japan Epoxy Resins Co., Ltd.)
"Semi-solid NP": Naphthalene type epoxy resin (HP-4032D, produced by DAINIPPON INK & CHEMICALS, INC.)
"Solid CN": Cresol novolak type epoxy resin (EOCN103, produced by NIPPON KAYAKU CO., LTD.)+solvent (diethylene glycol dimethyl ether)
The solvent content doesn't contain % by weight in Table 1.
Hardening Agent
"Acid anhydride": Acid anhydride-based hardening agent (Epicure YH307, produced by Japan Epoxy Resins Co., Ltd.)
Hardening Accelerator
"Imidazolel": Imidazole-based hardening agent (2E4MZ-CN, produced by Shikoku Chemicals Corp.)
Organic Filler
"Rubber filler": Rubber-based filler (XER-91, produced by JSR)
Liquid Rubber
"Epoxy-modified": Epoxy-modified butadiene rubber (E-1000-8.0, produced by NIPPON PETROCHEMICALS CO., LTD.)
Inorganic Filler
"Silica (diameter ϕ: 24 μm)": Silane coupling-treated silica (Tatsumori PLV-6: maximum particle diameter in particle size distribution: 24 μm)
"Silica (mixed)": Silane coupling-treated silica (7:3 (by weight) mixture of MS-35 produced by DENKI KAGAKU KOGYO K.K. and SO-C5 produced by Tatsumori Co., Ltd.; maximum particle diameter in particle size distribution: not smaller than 200 μm).

mounter. The embedding resin set forth in Table 1 is then allowed to flow into the gap between the chip capacitor disposed in the opening and the wall of the opening using a dispenser.

The embedding resin is subjected to primary heating step at a temperature of 80° C. for 3 hours and then to secondary heating at a temperature of 170° C. for 6 hours to undergo defoaming and heat curing. The surface of the embedding resin thus cured is subjected to rough polishing with a belt sander and then to finish polishing by lap polishing. Subsequently, the embedding resin is irradiated with carbon dioxide gas laser beam to form a via hole therein so that the electrode of the chip capacitor is exposed.

Thereafter, the polished surface of the embedding resins is subjected to roughening with a swelling solution and $KMnO_4$ solution. The roughened surface of the embedding resin is activated by a Pd catalyst, electrolessly plated with copper, and then electrolytically plated with copper. A resist is formed on the plated surface of the embedding resin. With this resist, a predetermined wiring pattern is formed on the plated surface of the embedding resin. The unnecessary copper is etched away with $Na_2S_2O_8$/concentrated sulfuric acid. The resist is peeled off from the embedding resin to complete the formation of a wiring.

A film as an insulating film is laminated on the roughened surface of the copper-plated wiring, and then subjected to heat curing. The insulating film is irradiated with laser beam to form a via hole for interlayer connection therein. The surface of the insulating layer is then roughened with the same oxidizing agent as used above. A predetermined wiring is formed in the same manner as mentioned above. A dry film as a solder resist layer is then laminated on the uppermost layer of the wiring circuit board. The dry film is exposed to light through a semiconductor element mounting pattern, and then developed to complete the formation of a solder resist layer.

TABLE 1

| Sample No. | Epoxy resin (wt-%) | Hardening agent (wt-%) | Hardening accelerator (wt-%) | Organic filler (wt-%) | Liquid rubber (wt-%) | Inorganic filler (wt-%) |
|---|---|---|---|---|---|---|
| 1 | Liquid BPF (11) | Acid anhydride (15) | Imidazole (0.1) | Rubber filler (4) | — | Silica (ϕ 24 μm) (70) |
| 2 | Liquid BPA (3) Liquid BPF (3) | Acid anhydride (14) | Imidazole (0.1) | — | Epoxy-modified (4) | Silica (ϕ 24 μm) (75) |
| 3 | Liquid BPF (5) Semi-solid NP (5) | Acid anhydride (15) | Imidazole (0.1) | — | Epoxy-modified (5) | Silica (ϕ 24 μm) (70) |
| 4 | Liquid BPA (18) | Acid anhydride (22) | Imidazole (0.1) | Rubber filler (3) | — | Silica (mixed) (60) |
| 5 | Liquid BPA (18) | Acid anhydride (22) | Imidazole (0.1) | — | — | Silica (mixed) (60) |
| 6 | Solid CN (12) * containing a solvent | Acid anhydride (14) | Imidazole (0.1) | — | Epoxy-modified (4) | Silica (ϕ 24 μm) (70) |
| 7 | Solid CN (13) * containing a solvent | Acid anhydride (14) | Imidazole (0.1) | — | — | Silica (ϕ 24 μm) (70) |

As the core substrate there is used a BT substrate having a thickness of 0.8 mm. Using a mold, a throughhole having a predetermined size is then formed in the core substrate. A backing tape is then stuck to one surface of the core substrate. The core substrate is then disposed with the backing tape side thereof facing downward. A chip capacitor is then inserted in the opening from the other side of the core substrate and disposed in the opening in a predetermined position on the adhesive side of the backing tape using a chip The terminal electrode on which a semiconductor is mounted is plated with Ni and then with Au. The wiring circuit board is then passed through a solder reflow furnace to form a solder bump for mounting a semiconductor. The mounted portion is then filled with an underfilling material using a dispenser. The underfilling material is then heat-cured to obtain an evaluation sample.

The evaluation sample thus obtained is then subjected to heat cycle test (−55° C. to +125° C.: 100 cycles) and PCT (pressure cooker) test (121° C.×2 atm.: 168 hours). The evaluation sample thus tested is then observed for surface conditions and cut area to evaluate the effective of the embedding resin. Those showing a pass of not lower than 85% are judged good. The results are set forth in Table 2.

For the measurement of the thermal expansion coefficient of the embedding resin, the embedding resin is formed into a sheet having a thickness of 100 μm. The sheet is subjected to primary heating step at a temperature of 120° C. for 1 hour and then subjected to secondary heating step at a temperature of 170° C. for 5 hours to undergo heat curing, and then cut into a specimen having a size of 4 mm×20 mm. The specimen thus prepared is then subjected to measurement by a thermal expansion coefficient meter. In some detail, the specimen is once cooled to a temperature of −60° C., and then subjected to measurement while being heated at a rate of 2° C. per minute. The thermal expansion coefficient thus measured falls within the range of from −50° C. to +130° C. The results are set forth in Table 2.

ductor elements mounted on the build-up layer disposed almost above the electronic parts can be obtained.

This application is based on Japanese patent applications JP 2000-212075, filed Jul. 13, 2000, and JP 2001-44795, filed Feb. 16, 2001, the entire contents of each of which are hereby incorporated by reference, the same as if set forth at length.

What is claimed is:

1. A wiring substrate comprising: a substrate having an opening; an electronic part disposed in the opening; and an embedding resin which comprises at least one of a soluble resin and a soluble organic filler as a soluble component to be dissolved with an oxidizing agent,
   wherein a gap between the substrate and the electronic part is filled with the embedding resin; and
   wherein the electronic part has at least one electrode, and the at least one electrode has a roughened surface having a roughness Rz of from 0.3 μm to 20 μm.

2. The wiring substrate according to claim 1 which further comprises at least one of a liquid epoxy resin and an

TABLE 2

| Sample No. | Thermal expansion coefficient (ppm/° C.) | Examination of external appearance after smoothening (pass: %) | Examination of cut area after heat impact test (pass: %) | Examination of cut area after PCT test (pass: %) |
| --- | --- | --- | --- | --- |
| 1 | 21 | 100 | 100 | 100 |
| 2 | 18 | 100 | 100 | 100 |
| 3 | 22 | 100 | 100 | 100 |
| 4 | 30 | 100 | 100 | 100 |
| 5 | 33 | 100 | 78 (cracks occur) | 65 (blister occurs) |
| 6 | 20 | 85 (voids occur) | 100 | 100 |
| 7 | 25 | 80 (voids occur) | 70 (cracks occur) | 60 (blister occurs) |

Sample Nos. 1 to 4 and 6, which comprised a soluble organic filler or soluble resin soluble in an oxidizing agent, underwent no blister of copper layer due to peeling after PCT test and thus showed a good adhesion, Sample No. 3, which additionally comprised a semi-solid naphthalene type epoxy resin, showed good results.

Figure 4:
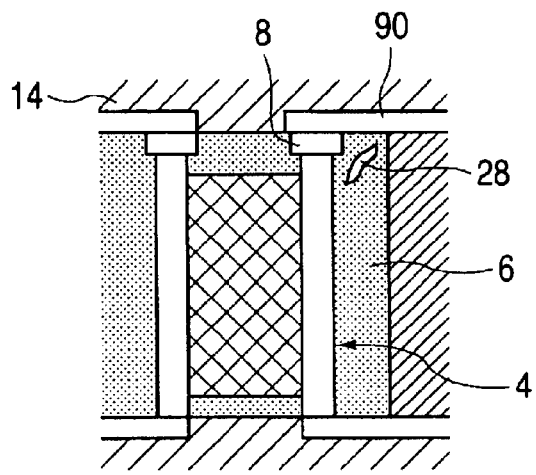
FIG. 4 is a diagram illustrating an example of the state of cracks generated in the embedding resin.

On the contrary, Sample Nos. 5 and 7, which were free of soluble organic filler or soluble resin soluble in an oxidizing agent, underwent blister of copper layer due to peeling after PCT test (ex. reference numeral 29 in FIG. 5) or cracks in the embedding resin (ex. reference numeral 28 in FIG. 4). As can be seen in these results, the addition of a soluble organic filler or soluble resin soluble in an oxidizing agent makes it possible to improve the adhesion of the embedding resin to the copper layer. It can also be seen that an effect can be exerted to relax the concentration of stress and hence prevent the occurrence of crack.

Sample No. 6, which comprised a solid epoxy resin, showed the occurrence of voids attributed to the volatile solvent which had been added to cope with the rise of viscosity of the embedding resin. It can be seen that the epoxy resin, if used, is preferably a liquid epoxy resin.

In accordance with the invention, an embedding resin having a good adhesion to a wiring made of copper or the like and an electronic part-embedded wiring circuit board comprising the embedding resin can be obtained. By facilitating the roughening of the surface of the embedding resin, an anchoring effect can be exerted to improve its adhesion to the wiring. Further, a wiring circuit board having an improved reliability in electrical connection over the range from the electronic parts embedded therein to the semiconinorganic filler as an undissolved component that is not substantially dissolved in the oxidizing agent.

3. The wiring substrate according to claim 2, wherein the liquid epoxy resin is a bisphenol epoxy resin.

4. The wiring substrate according to claim 1, which further comprises a wiring, wherein the wiring is provided at least partly on the embedding resin, and the embedding resin is roughened at least on an interface thereof in contact with the wiring.

5. The wiring substrate according to claim 1, which further comprises a semiconductor disposed substantially above the electronic part.

6. The wiring substrate according to claim 1, which comprises: a core substrate and a built-up layer provided on at least one side of the core substrate and formed by alternately laminating an insulating layer and a wiring layer, wherein the core substrate and the built-up layer has the opening penetrating therethrough.

7. A process for producing a wiring substrate which comprises:
   a mounting step of disposing an electronic part in an opening provided in a substrates wherein the electronic part has at least one electrode, and the at least one electrode has a roughened surface having a roughness Rz of from 0.3 μm to 20 μm;
   an embedding step of filling a gap in the opening in which the electronic part has been disposed, with an embedding resin comprising at least one of a soluble resin and a soluble organic filler as a soluble component to be dissolved with an oxidizing agent;

a roughening step of dissolving the at least one of the soluble resin and the soluble inorganic tiller contained in the embedding resin with an oxidizing agent to form an eluted portion, forming a roughened surface on the exposed surface of the embedding resin; and a wiring forming step of forming a wiring on the roughened surface.

8. A wiring substrate comprising: a substrate having an opening; an electronic part disposed in the opening; and an embedding resin which comprises at least one of a soluble resin and a soluble organic filler as a soluble component to be dissolved with an oxidizing agent;

wherein a gap between the substrate and the electronic part is filled with the embedding resin; and which further comprises a semiconductor disposed substantially above the electronic part, and the semiconductor is connected to the electronic part through a via hole penetrating the built-up layer provided between the semiconductor and the electronic part.

* * * * *